(12) United States Patent
Chen

(10) Patent No.: US 6,215,821 B1
(45) Date of Patent: *Apr. 10, 2001

(54) COMMUNICATION SYSTEM USING AN INTERSOURCE CODING TECHNIQUE

(75) Inventor: Howard Zehua Chen, Berkeley Heights, NJ (US)

(73) Assignee: Lucent Technologies, Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/693,423

(22) Filed: Aug. 7, 1996

(51) Int. Cl.[7] ...................................................... H04B 1/66
(52) U.S. Cl. .......................................................... 375/240.05
(58) Field of Search .................................... 348/385, 384, 348/401, 390, 389, 412, 400, 408, 409; 341/67, 50, 63, 65; 358/146, 84; 370/477, 493; 455/466; 379/106.01–106.11; 395/706; 375/240.05; 382/234

(56) References Cited

U.S. PATENT DOCUMENTS

| Re. 34,824 | * | 1/1995 | Morrison et al. ...................... 348/419 |
| 5,136,411 | * | 8/1992 | Paik et al. .............................. 358/84 |
| 5,216,503 | * | 6/1993 | Paik et al. ............................. 348/385 |
| 5,231,494 | * | 7/1993 | Wachob ................................. 358/146 |
| 5,233,348 | * | 8/1993 | Pollman et al. ....................... 341/67 |
| 5,317,734 | * | 5/1994 | Gupta .................................. 395/706 |
| 5,361,096 | * | 11/1994 | Ohki et al. ........................... 348/419 |
| 5,414,469 | * | 5/1995 | Gonzales et al. ..................... 348/408 |
| 5,442,626 | * | 8/1995 | Wei ...................................... 348/384 |
| 5,491,515 | * | 2/1996 | Suzuki ................................. 348/401 |
| 5,633,683 | * | 5/1997 | Rosengren et al. .................. 348/385 |
| 5,663,962 | * | 9/1997 | Caire et al. .......................... 348/419 |
| 5,666,461 | * | 9/1997 | Igarashi et al. ...................... 348/400 |
| 5,666,487 | * | 9/1997 | Goodman et al. ................... 348/384 |
| 5,677,980 | * | 10/1997 | Naoe ................................... 348/384 |

* cited by examiner

*Primary Examiner*—Chris Kelley
*Assistant Examiner*—Gims S. Philippe
(74) *Attorney, Agent, or Firm*—Wolff & Samson

(57) ABSTRACT

A method and apparatus for achieving maximum bandwidth reduction in communication networks. The invention provides a multisource coding scheme, implemented through an intersource coding block that provides maximum bandwidth reduction for transmissions from a plurality of time-correlated information sources over a single physical link. In one embodiment of the invention the intersource encoder uses run-length coding to compress the aggregate bit rate before the physical transmission. The intersource encoder provides data compression for both completely correlated and partially correlated sources. For completely correlated sources, the intersource encoder strips off the intersource redundancies and transmits only a single copy of the information over the physical link, wherein the single copy is a superpicture. For partially correlated sources, the intersource encoder compresses the aggregate signal through a predetermined coding scheme, including vector run-length coding.

40 Claims, 8 Drawing Sheets

COMMUNICATION SYSTEM USING AN INTERSOURCE CODING TECHNIQUE

FIELD OF THE INVENTION

This invention relates to communication systems, networks, and more particularly to transmission techniques for networked information sources.

BACKGROUND OF THE INVENTION

Heretofore, data compression methods have been designed to compress the bit rate of signals transmitted from a single source. This includes such methods as employed in adaptive delta modulation for voice compression, Joint Photographic Experts Group (JPEG) compression for still images, Motion Picture Expert Group (MPEG) compression for real-time video, and entropy coding for data files. These compression methods are known as source coding in communication or information theory, and they are most effective in situations where there is a single-point to single-point transmission over a physical link, such as a telephone line. These compression methods reduce the amount of information that needs to be transmitted from a source, and they often provide large communication bandwidth reductions in single-point to single-point transmissions.

When, however, a multitude of information sources are transmitted over a single shared physical link as a multitude of data streams, such present day source coding methods alone do not provide the largest possible bandwidth reduction. In such multi-source to multi-source (hereinafter "multi-stream") communications, the signal from each data source is separately compressed using a particular source coding method optimized for that source. The compressed signals are then summed or multiplexed onto a single physical link to be transmitted over a network. In the most popular network known as synchronous time multiplexed ("STM" hereafter) network, each data stream is assigned a certain time slot in a data frame that is predefined by the network. As a result, in an STM network having a plurality of sources communicating over a single physical link, the multiple data streams do not overlap in time, and there is no interaction among the data streams as they are transmitted over the physical link.

The disadvantage of present day STM multistream communications over a single link, however, is that when the different data streams are partially correlated (i.e. when some sources store the same data bit at the same time), redundant data is carried on the communication link. As a result, when the sources are at least partially correlated, present day system can waste a significant amount of transmission bandwidth by communicating redundant data over the link at the same time.

Some present day communication networks reduce the transmission bandwidth of multistream communications over a single physical link by combining the multiple streams into an aggregate signal. Such systems are designed with the assumption that the data streams carried on the communication link are statistically independent of one another. As a result, when the data streams are combined into an aggregate signal transmitted over the single communication link, the bit rate of the aggregate signal is often less than the sum of the individual data stream bit rates. This is known as statistical multiplexing gain (SMG). Typically, SMG is obtained by transmitting information of a momentarily ON source (i.e. a source transmitting during that moment) during the time slot of a momentarily OFF source (a source not transmitting during that moment).

In a present day network designed to take advantage of SMG, such as an asynchronous transfer mode (ATM) network, data buffers are designed as shared buffers with a certain SMG expected. When, however, the data streams are partially correlated (i.e. the sources exhibit similar ON/OFF behavior), the buffers may not have the capacity to handle all the information from the multiple sources. As a result, the buffer overflow forces the network to discard information, thus substantially reducing the network's ability to realize any SMG. Consequently, for ATM networks providing multisource, partially correlated transmission over a single link, there are additional bandwidth problems associated with buffer overflow.

SUMMARY OF THE INVENTION

Accordingly, the present invention is directed to a method and apparatus for achieving maximum bandwidth reduction, with or without buffer overflow problems, for both correlated and uncorrelated transmissions from a plurality of data sources communicating over a single physical link. To attain this, the present invention provides an intersource encoder having a multisource ("multi-stream") coding scheme that substantially reduces the transmission bandwidth of a plurality of content-correlated sources communicating in the form of an aggregate signal over a single physical link.

In one embodiment of the invention, an intersource encoder is used to reduce the aggregate bit rate of the multi-stream traffic on a single physical link. The intersource encoder provides data compression for both completely correlated and partially correlated sources. For completely correlated sources, wherein all sources transmit the same information at a given time, only a single copy is transmitted over the physical link. The redundant transmissions of the same data packet are avoided by performing a caching-equivalent step at the lowest physical OSI layer. For partially correlated sources, wherein some of the sources share the same data bit at a given time, the intersource encoder removes the bits on which the sources agree, and leaves intact the bits on which the sources do not agree. The term "sources" herein refers to the end users and any intermediary node in the network between the end users.

In another embodiment of the invention, a high-speed digital shift register is used as a binary storage device for the information bits contained in the data streams. This enables the application of all the lossless video and picture compression techniques of the prior art in the present invention. These and other features of the invention are described in more detail in the following detailed description of the embodiments of the invention when taken with the drawings. The scope of the invention, however, is limited only by the claims appended hereto.

DETAILED DESCRIPTION OF EMBODIMENTS OF THE INVENTION

Figure 1:
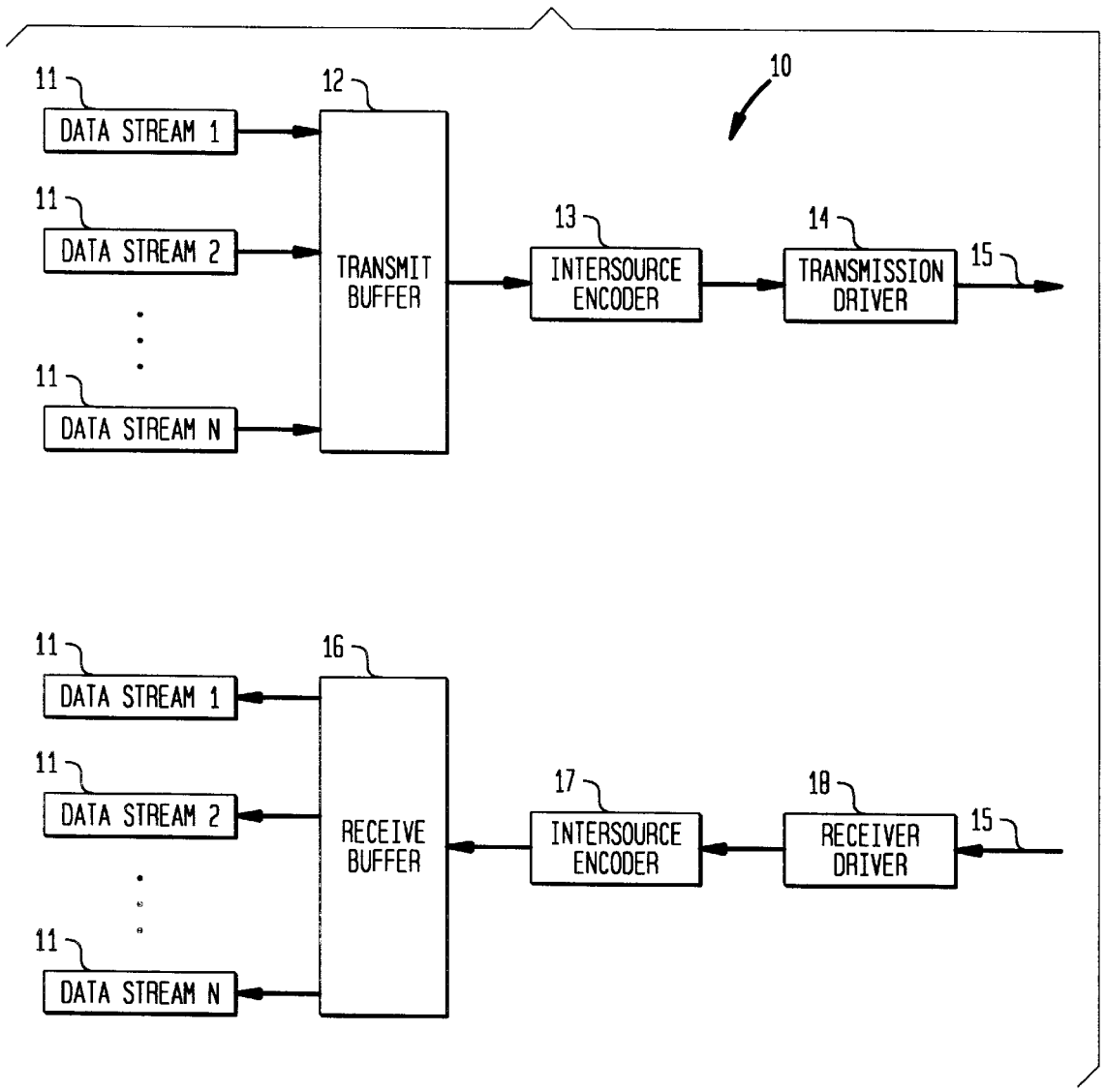
FIG. 1 is a block diagram showing the data transmission and receiver paths of one embodiment of the invention in a compressed multi-stream to multi-stream (multi-source) communication network using a single, shared physical link.

Referring now to FIG. 1 there is shown a communications network employing one embodiment of the intersource data compression technique of the present invention, hereinafter referred to as network 10. Network 10 has a plurality of correlated data sources 11 electrically coupled to transmit buffer 12 and receive buffer 16. Transmit buffer 12 is electrically coupled to intersource coding block or encoder 13 which, in turn is electrically coupled to transmission driver 14. Transmission driver 14 is electrically coupled to shared physical link 15. Shared physical link 15 is also electrically coupled to receiver driver 18. Receiver driver 18 is electrically coupled to intersource decoder 17 which, in turn is electrically coupled to receiver buffer 16. As stated above, the term "sources" herein refers to the end users and any intermediary node in the network between the end users. Also, although "sinks" are not mentioned herein, it is understood that a source ends with a sink.

Figure 2:
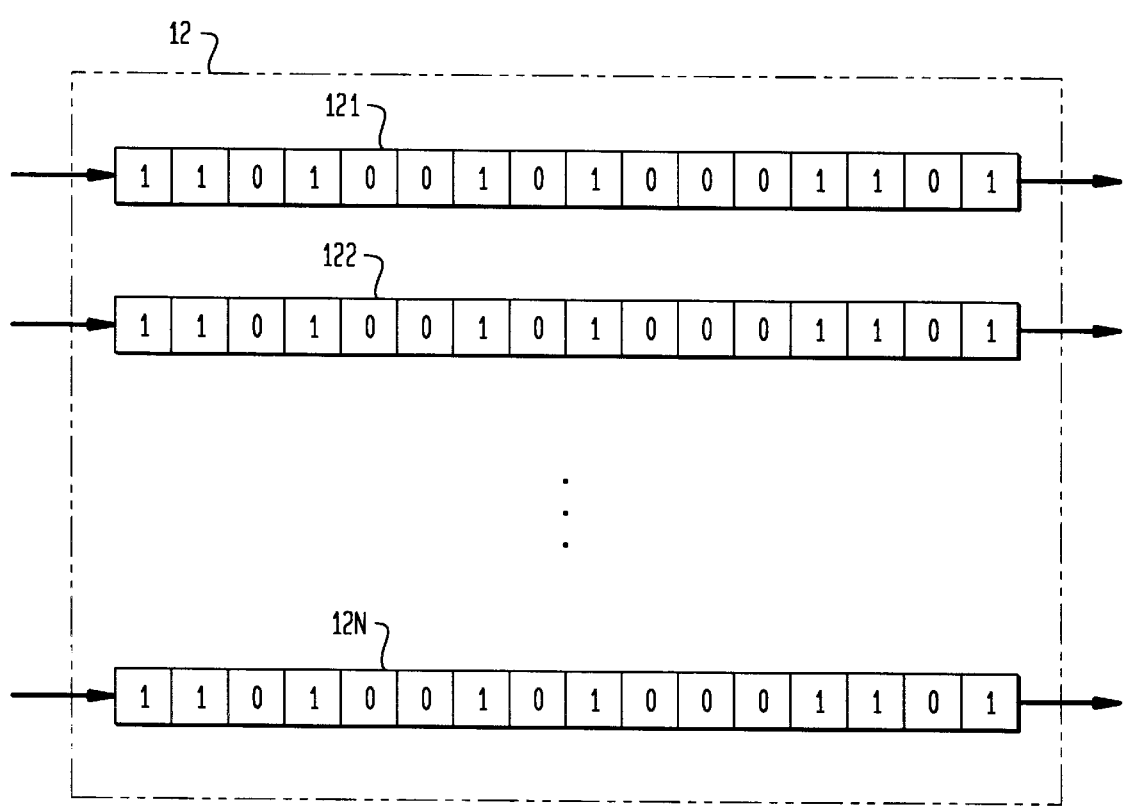
FIG. 2 is a diagrammatic view of the transmission path of the multi-stream transmit buffer shown in the embodiment of FIG. 1.

A more detailed view of transmit buffer 12 of network 10 is shown in FIG. 2. As shown, transmit buffer 12 has a set of bit registers 121 through 12N wherein N is the number of sources sharing link 15. As a result, buffer 12 has N registers, wherein each register provides storage for a given set of information (e.g. a binary picture) from each source 11. The bits of these binary pictures are passed from buffer 12 to intersource encoder 13 for the reduction of redundant intersource information. That is, intersource encoder 13 substantially reduces the redundant information between the binary pictures from each source so that the aggregate signal (not shown), made by combining all the source information, is transmitted through driver 14 on physical link 15.

Figure 3:
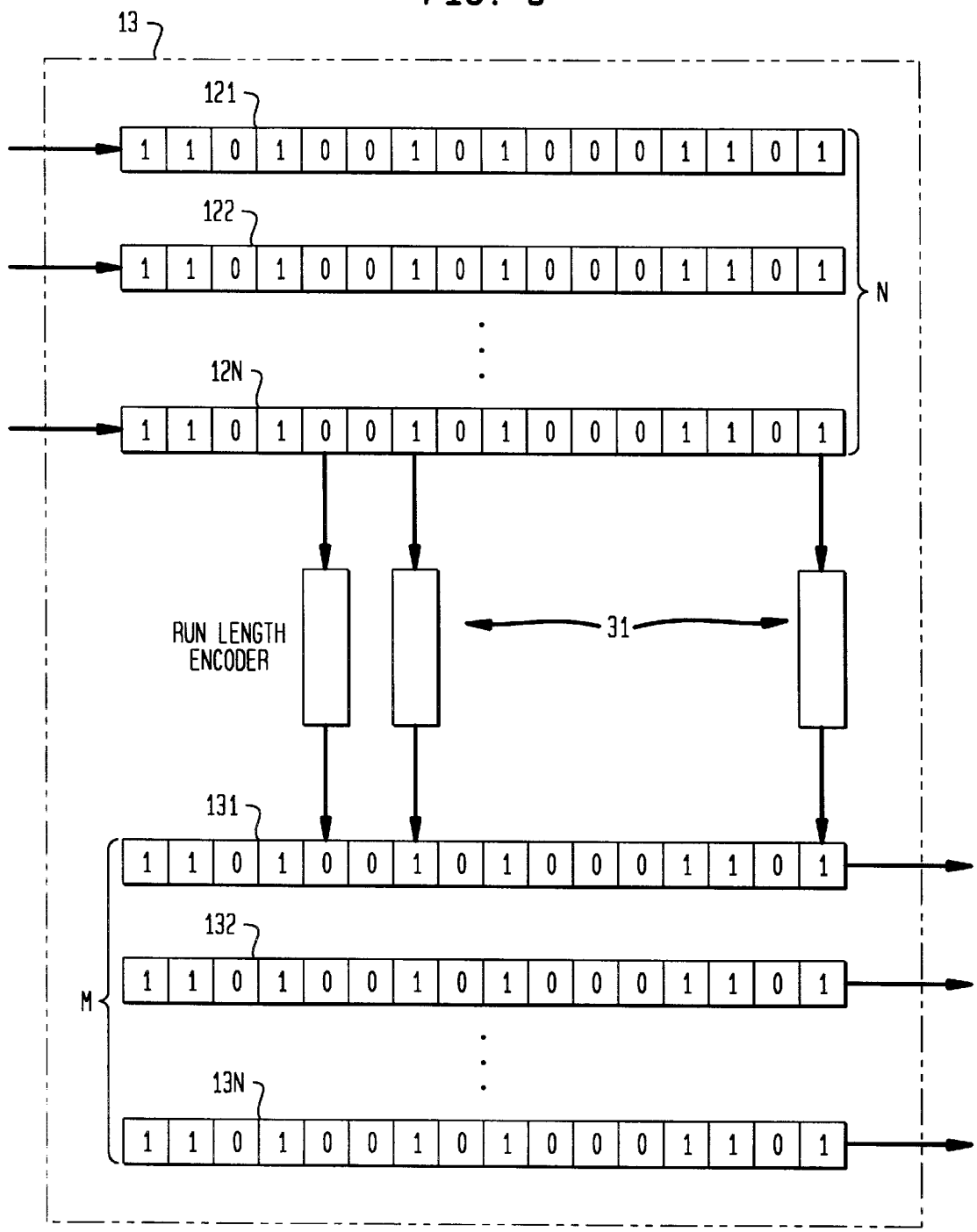
FIG. 3 is a diagrammatic view of the transmission path of the intersource encoder shown in the embodiment of FIG. 1.

A more detailed view of intersource encoder 13 of embodiment 10 is shown in FIG. 3. As shown, intersource encoder has a run length encoder 31 coupled to register 121 through 12N of buffer 12 and to registers 131 through 13M, wherein M (M ≦N) is the number of bits in each binary picture after run length coding. The output of registers 131 through 13M are coupled to transmission driver 14 which, in turn, is coupled to physical link 15 which carries the aggregate signal (not shown). For each bit slice, M ≦N, transmission bandwidth has been changed with no information loss.

The receiver path of the aggregate signal is similar to the transmit path discussed above. As shown in FIG. 1 receiver driver 18 receives the aggregate signal (not shown) from physical link 15, and sends that signal to intersource decoder 17 which separates the aggregate signal into its respective data streams 11 through receive buffer 16. A detailed view of the receiver path of network 10 is shown in FIGS. 4 and 5.

Figure 4:
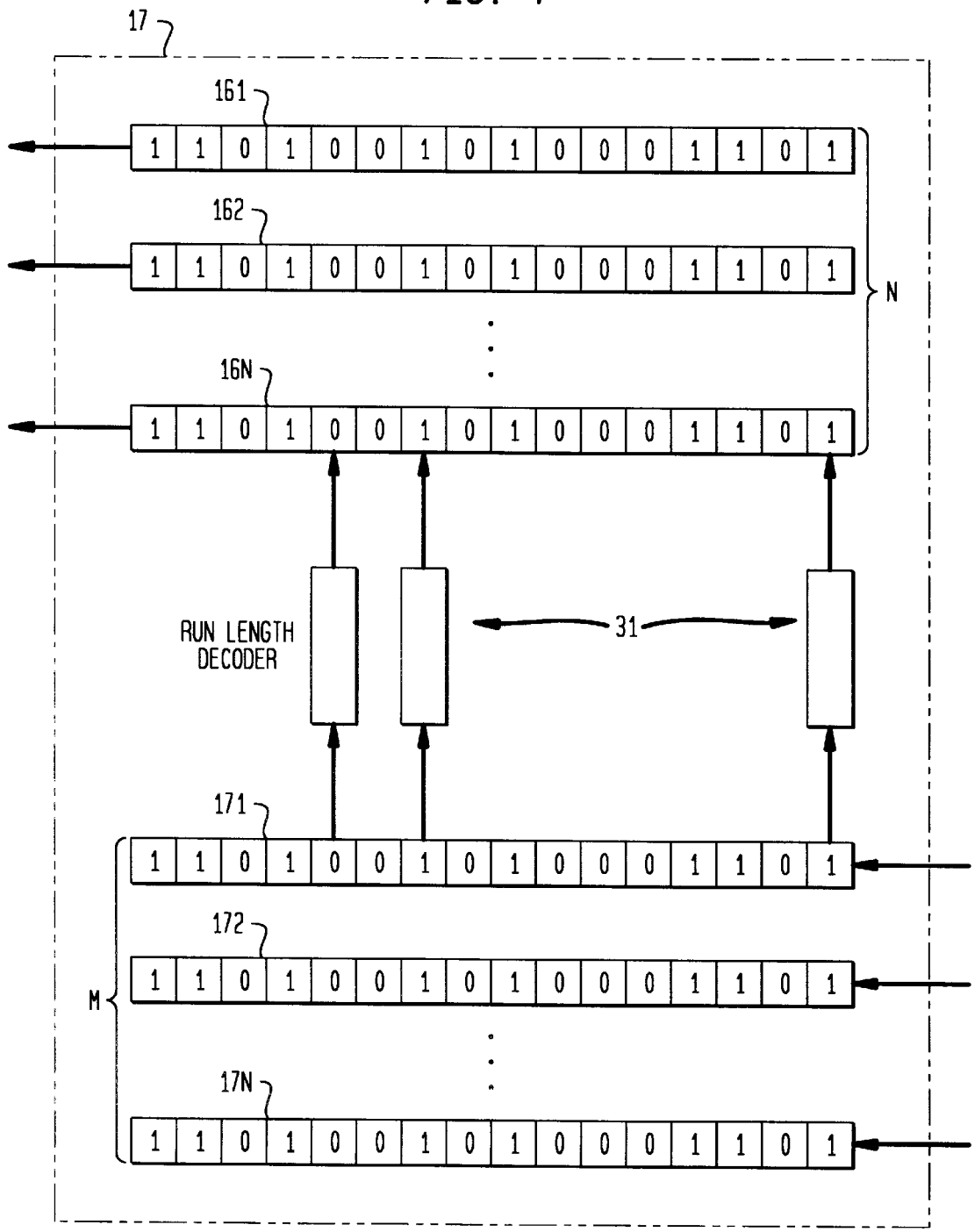
FIG. 4 is a diagrammatic view of the intersource decoder path for communication system shown in FIG. 1.
Figure 5:
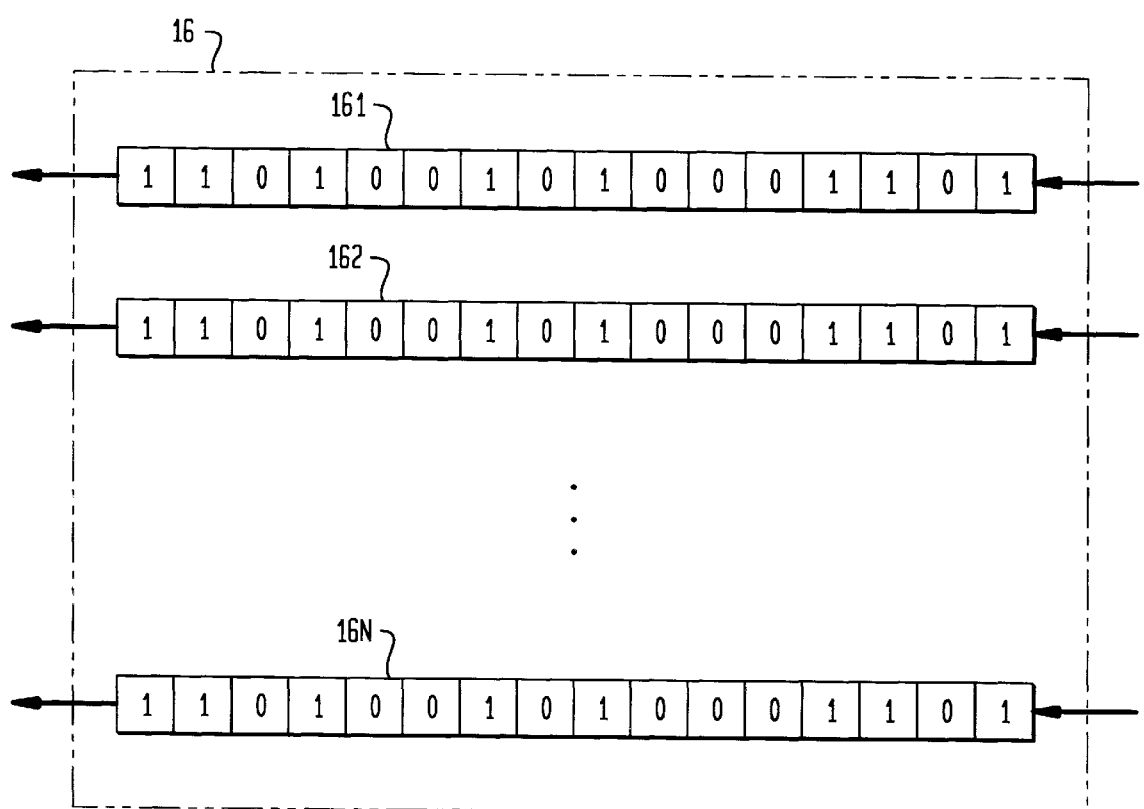
FIG. 5 is a diagrammatic view of the receiver path of the receive buffer for communications on the system shown in FIG. 1.

As shown in FIG. 4, intersource decoder 17 has a run-length decoder 41 coupled between receiver register 171 through 17M and 161 through 16N, wherein M is the number of compressed bits in a binary picture as described above, and N is the number of data streams 11. Run length decoder 41 separates the individual data streams from the received aggregate signal and places them in the registers 161 through 16N of buffer 16 for transfer to respective data streams 11. A detailed view of the binary bits in register 161 through 16N of receive buffer 16 is shown in FIG. 5

In another embodiment, conventional single-stream compression methods can be used on multi-stream traffic. For example, assuming network 10 provides a conventional ATM variable bit rate (VBR) transmission from N partially correlated sources 11, each transmitting a sequence of binary pictures denoted by $\{P_1\}$, $\{P_2\}$,... $\{P_N\}$, at any given time, network 10 transmits an aggregate compressed signal over link 15. First, the binary pictures or signals from each source 11 are temporarily stored in transmit buffer 12, wherein they are added to achieve a statistical multiplexing gain. Then, before being transmitted over link 15, the aggregate signal is sent to intersource coding block 13 or any other lossless compressor, wherein the signal is compressed. Since most advanced compression schemes in the prior art are designed for video, use of the term "picture" herein is intended to refer to any bit-slice, as shown in FIG. 8.

To compress the signal, intersource encoder 13 performs run-length coding on the aggregate of the pictures from sources 11 to form a superpicture. Depending on whether sources 11 are completely or only partially correlated, intersource encoder 13 will perform different steps to form the superpicture 21. When sources 11 are completely correlated, intersource encoder 13 strips-off the intersource redundancies and transmits only a single copy of the information. When, however, sources 11 are partially correlated, intersource encoder 13 compresses strings of 1's and 0's through vector run-length coding techniques. That is, intersource encoder vector codes any strings of 1's and 0's that run the length of a position between the pictures of different sources. The strings of 1's and 0's that run along a line within a picture, however, are not so vector coded. Thus, the intersource encoder provides intersource compression as opposed to intrasource or frame to frame compression. This substantially reduces the bandwidth requirements on a network wherein a plurality of sources communicate over a single physical link.

In one embodiment of encoder 13, digital shift registers can be used as binary storage devices for storing information bits within the pictures. To provide the intersource compression, a particular bit from each source is read-out of the registers, either in parallel or sequentially, to perform the vector run-length coding described above. FIG. 8 illustrates both a serial and a parallel implementation of such run length encoding. As shown, for serial run-length coding of the pictures generated by partially correlated sources 11, the first bit from each picture is vector run-length coded to generate output 1. Similarly, the second bit from each picture is vector run-length coded to generate output 2, and so forth up to the last or M-th bit.

Figure 8:
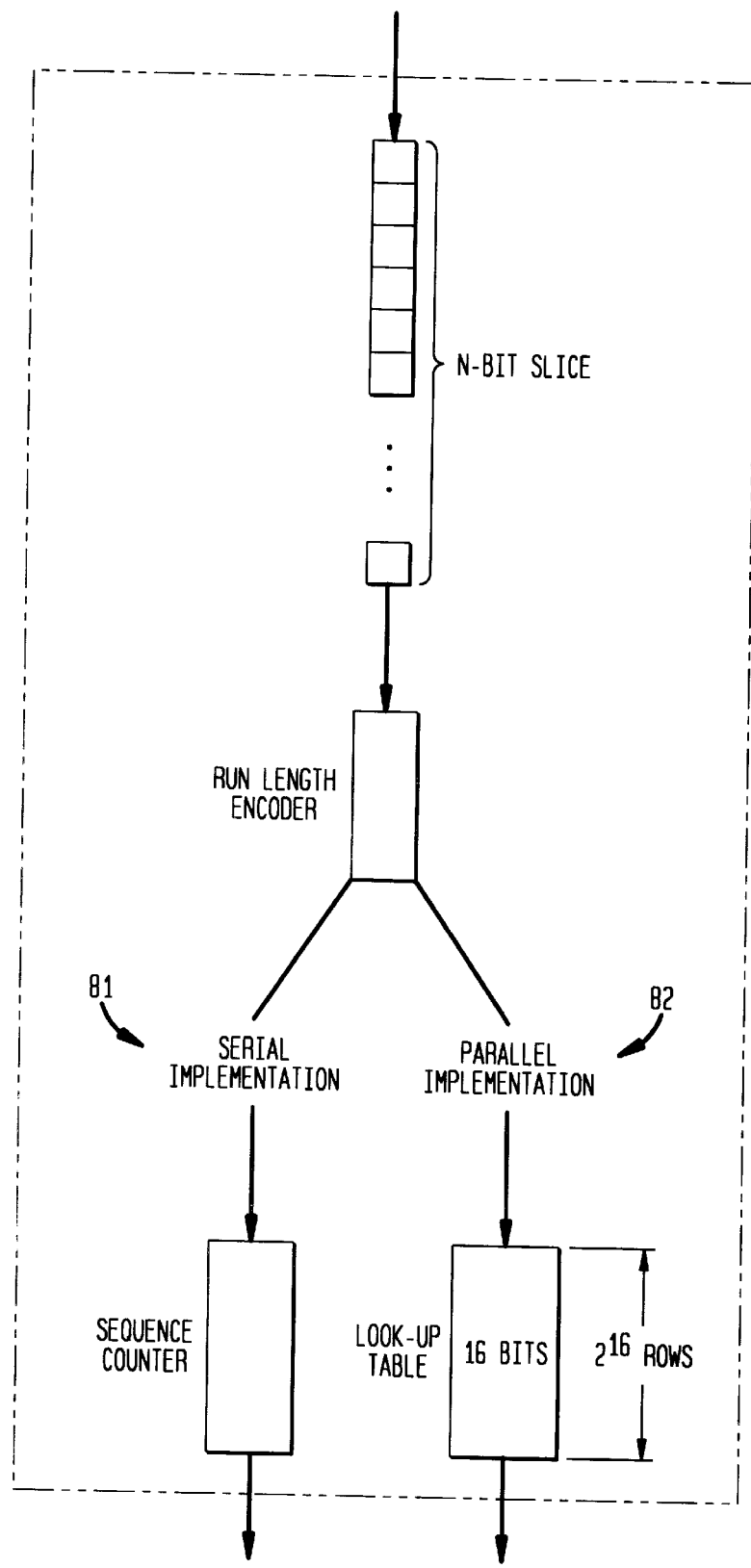
FIG. 8 shows two of many possible constructions of the run-length encoder shown in FIG. 3.

In the parallel implementation of the vector run-length coding shown in FIG. 8. The N bits of the picture from each source is passed into a predetermined shift register to form the N-th row therein. Each row of bits is then compared, in parallel, to a set of digital words contained in a look-up table to quickly determine the substantially exact match therein. The address (having fewer bits than the row of bits) for the match is then sent over the physical link, resulting in a predetermined bandwidth savings. In addition, the process can be repeated several times until the information can not be compressed any further. The parallel implementation, however, is best suited for systems wherein the number of correlated sources is relatively small (e.g. N=16).

In general, vector run-length coding involves the generation of run-length sequences that indicate the number of bits required to communicate the information contained in a long sequence of bits. For example, a bit stream of 110000101000111 (15 bits) results in a run-length sequence of 2,4,1,1,1,3,3. This sequence requires a total of 1+2+1+1+1+2log$_2$ 3 =9.17 bits, which results in a compression ratio of 15/9.17 =1.64. As a result, vector run-length coding such a sequence of bits results in a bandwidth savings of approximately 39%. Although, there is a possibility of the rare case of alternating 1's and 0's (e.g. 10101010101010), which results in a zero compression ratio under vector run-length coding, it rarely occurs.

It is emphasized that although run-length coding is used here to demonstrate intersource compression in the present embodiment, there are other coding schemes that may provide even more efficient compression than vector run-length coding. For example, a system under the present invention can use Huffman coding or any other lossless entropy coding techniques to achieve such intersource compression. The design philosophy of the present inventive system, however, is the same for each system. That is, to substantially reduce intersource redundancies for a plurality of correlated or partially correlated sources communicating over a single physical link.

Figure 6:
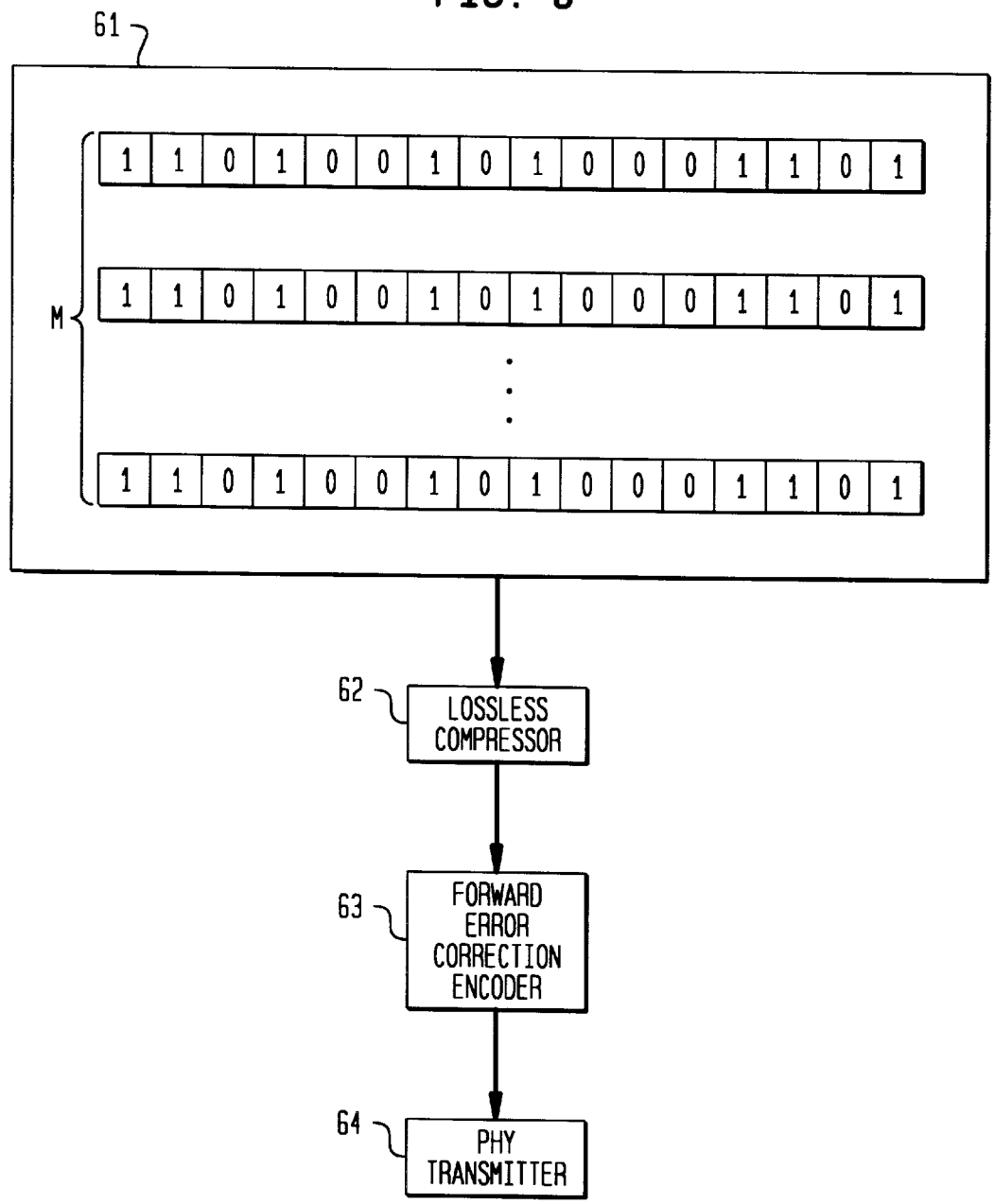
FIG. 6 is a block diagram showing another embodiment of the transmission path of the communication system according to the present invention.
Figure 7:
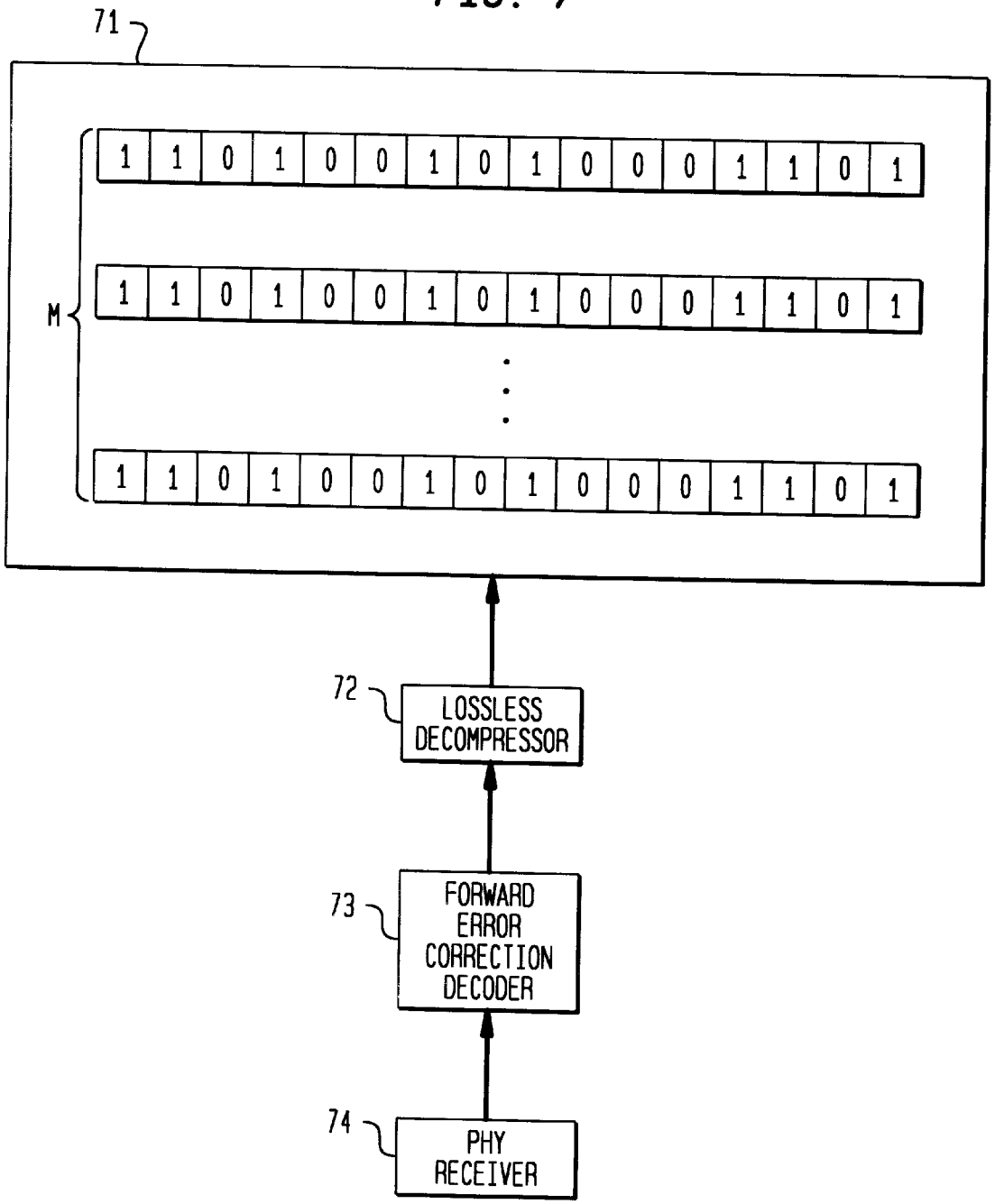
FIG. 7 is a block diagram showing the receiver path for communications on the system shown in FIG. 6.

Alternate embodiments of the transmission path and the receiver path of a network providing such intersource data compression is shown in FIGS. 6 and 7, respectively. As shown in FIG. 6, transmit buffer 61 has a set of registers for temporarily storing the information bits from a plurality of sources. Transmit buffer is coupled to lossless compressor 62 which, in turn, is coupled to forward error correction encoder 63. Forward error correction encoder 63 is coupled to transmitter 64 which, in turn, is coupled to a single physical link (not shown). As shown in FIG. 7. the signal receive path includes a receiver 74 coupled to a forward error correction decoder 73 which, in turn, is coupled to a lossless decompressor 72. Lossless decompressor 72 is coupled to receive buffer 71. In operation, the embodiment of a network according to the present invention, as illustrated in FIGS. 6 and 7, provides intersource encoding and decoding, to ultimately provide intersource data compression for the reduction of redundancies of the information between the sources communicating on the network. Thus, FIGS. 6 and 7 further illustrate the various embodiments and the scope of the present invention.

What is claimed is:

1. In a network operative to combine a plurality of parallel data streams into an aggregate signal, said plurality of data streams being characterized by some degree of inter-stream content correlation, an apparatus for providing a reduction in bandwidth required for said aggregate signal comprising:
    a plurality of registers operative to receive bits from ones of said plurality of data streams, for temporarily storing corresponding bit sequences for said ones of said data streams;
    means for selecting a set of inter-stream bit values for a given register position among at least a portion of said plurality of registers; and
    an inter-stream coding device operative to encode said selected set of inter-stream bit values in relation to said inter-stream correlation occurring at said given register position.

2. The apparatus of claim 1 wherein data streams in said at least a portion of said plurality of data streams are at least partially correlated.

3. The apparatus of claim 2 wherein said redundant data increments are related to said correlation among said data streams.

4. The apparatus of claim 1 wherein said inter-stream data increments are selected from a common data increment position across said data streams.

5. The apparatus of claim 1 further comprising a buffer for temporarily storing data in said plurality of data streams before being combined into said aggregate signal.

6. The apparatus of claim 5 further comprising a transmission driver for causing said aggregate signal to be transmitted over a physical link, and a receiver driver for receiving said aggregate signal from said physical link.

7. The apparatus of claim 1 wherein said inter-stream coding device includes digital shift registers for storing data from ones of said plurality of data streams, wherein said shift registers contains particular ones of said selected inter-stream data increments at a given time.

8. The apparatus of claim 7 wherein said inter-stream coding device removes said inter-stream redundancies through vector run-length coding.

9. The apparatus of claim 8 wherein said vector run-length coding is performed through a sequential reading-out of contents of said shift register to form a run-length sequence.

10. The apparatus of claim 8 wherein said vector run-length coding is performed through a parallel reading-out of contents of said shift register to form a run-length sequence, said run-length sequence being thereby compared with a stored database of sequence patterns to form an encoding.

11. The apparatus of claim 7 wherein said inter-stream coding device removes said inter-stream redundancies through Huffman coding.

12. The apparatus of claim 7 wherein said inter-stream coding device removes said inter-stream redundancies through a given entropy coding technique.

13. In a data transmission system wherein a plurality of parallel data streams having some degree of inter-stream content correlation are combined into a common transmission stream, a method for providing a reduced bandwidth requirement for said common transmission stream, comprising the steps of;
    selecting a set of inter-stream bit values for a given bit position in ones of said plurality of parallel data streams for at least a portion of said plurality of data streams; and
    operating on said selected set of inter-stream bit values to encode said selected set of inter-stream bit values in relation to inter-stream content correlation occurring at said given bit position.

14. The method of claim 13 wherein data streams in said at least a portion of said plurality of data streams are at least partially correlated.

15. the method of claim 14 wherein said redundant data segments are related to said correlation among said data streams.

16. The method of claim 13 wherein said inter-stream data segments are selected from a common data segment position across said data streams.

17. The method of claim 13 further comprising the step of temporarily storing data segments of said at least a portion of said plurality of streams in a transmit buffer before combining said data streams into said common transmission stream.

18. The method of claim 17 further comprising the steps of transmitting said common transmission stream over a physical link, and receiving said common transmission stream from said physical link.

19. The method of claim 13 wherein said data segments for said plurality of data streams are temporarily stored in digital shift registers, and further wherein said shift registers contain particular ones of said selected inter-stream data segments at a given time.

20. The method of claim 19 wherein said step of removing redundant data segments operates through application of vector run-length coding.

21. The method of claim 20 wherein said vector run-length coding is performed through a sequential reading-out of contents of said shift register to form a run-length sequence.

22. The method of claim 20 wherein said vector run-length coding is performed through a parallel reading-out of contents of said shift register to form a run-length sequence, said run-length sequence being thereby compared with a stored database of sequence patterns to form an encoding.

23. The method of claim 19 wherein said step of removing redundant data segments operates through application of Huffman coding.

24. The method of claim 19 wherein said step of removing redundant data segments operates through application of a given entropy coding technique.

25. The apparatus of claim 1 wherein said inter-stream coding device is comprised of an encoder and a decoder.

26. The apparatus of claim 1 wherein said inter-stream coding device further comprises a lossless image compressor, a forward error corrector, and an asynchronous transfer mode transmitter.

27. The apparatus of claim 1 wherein said inter-stream coding device compresses the plurality of data streams into a supersignal to substantially reduce transmission bandwidth requirements.

28. The apparatus of claim 1 wherein data comprising ones of said plurality of data streams is representative of a sequence of pictures and said step of removing redundant data increments includes the substeps of:
  a. buffering a picture from each data stream at a given time to form a set of pictures;
  b. run-length coding said set of pictures to form a run-length sequence; and
  c. deriving a set of bits to comprise a portion of said aggregate signal from said run-length sequence, wherein the number of bits in said set of bits is less than the number of pictures in said set of pictures.

29. The apparatus of claim 1 wherein said data comprising ones of said plurality of data streams is representative of a sequence of pictures and said step of removing redundant data increments includes the substeps of:
  a. buffering a picture from each data stream at a given time to form a set of pictures;
  b. placing the j-th bit from each picture in said set of pictures into a predetermined register to form a bit word;
  c. performing a parallel comparison of said bit word with bit words in a lookup table to determine a closest match therein; and
  d. repeating steps b and c for each bit of said pictures.

30. The apparatus of claim 8 wherein said run-length coding includes the substeps of:
  a. buffering a picture from each data stream at a given time to form a set of pictures;
  b. run-length coding said set of pictures to form a run-length sequence; and
  c. deriving a set of bits to comprise a portion of said aggregate signal from said run-length sequence, wherein the number of bits in said set of bits is less than the number of pictures in said set of pictures.

31. The apparatus of claim 8 wherein said vector run-length coding includes the substeps of:
  a. buffering a picture from each data stream at a given time to form a set of pictures;
  b. placing the j-th bit from each picture in said set of pictures into a predetermined register to form a bit word;
  c. performing a parallel comparison of said bit word with bit words in a lookup table to determine a closest match therein; and
  d. repeating steps b and c for each bit of said pictures.

32. A method for compression of transmission bandwidth for an aggregate signal formed from combining a plurality of parallel data streams having some degree of inter-stream content correlation, said method comprising the steps of:
  temporarily storing sets of bit values for corresponding portions of ones of said plurality of parallel data streams in a corresponding plurality of registers;
  for a given register position, selecting bit values stored in said given register position for each of said plurality of registers; and
  operating on said selected bit values to encode said selected values in relation to inter-stream content correlation occurring at said given register position.

33. The bandwidth compression method of claim 32 wherein said selecting and said operating steps are iteratively repeated for substantially all register positions, and a resultant of each other said iteratively repeated operating steps is combined to form said aggregate signal.

34. The bandwidth compression method of claim 32 wherein data streams comprising said plurality of data streams are at least partially correlated.

35. The bandwidth compression method of claim 32 wherein said step of operating on said selected data segments carries out an encoding methodology.

36. The bandwidth compression method of claim 35 wherein said encoding methodology is run length encoding.

37. The bandwidth compression method of claim 35 wherein said encoding methodology is Huffman encoding.

38. The bandwidth compression method of claim 35 wherein said encoding methodology is applied seriatim to said selected data segments .

39. The bandwidth compression method of claim 35 wherein said encoding methodology operates to compare said selected data segments, as a group, with a database of stored data segment patterns, wherein a one of said stored patterns found to be a closest match for said selected data segments represents an encoding for said selected data segments.

40. The bandwidth compression method of claim 32 wherein said data segment is a data byte.

* * * * *